US012660637B2

(12) United States Patent
Hsu et al.

(10) Patent No.: US 12,660,637 B2
(45) Date of Patent: Jun. 16, 2026

(54) PACKAGE CARRIER BOARD INTEGRATED WITH INDUCTIVE CIRCUIT STRUCTURE AND MANUFACTURING METHOD THEREOF

(71) Applicant: Phoenix Pioneer Technology Co., Ltd., Hsinchu County (TW)

(72) Inventors: Che-Wei Hsu, Hsinchu County (TW); Pao-Hung Chou, Hsinchu County (TW); Shih-Ping Hsu, Hsinchu County (TW)

(73) Assignee: Phoenix Pioneer Technology Co., Ltd., Hsinchu County (TW)

( * ) Notice: Subject to any disclaimer, the term of this patent is extended or adjusted under 35 U.S.C. 154(b) by 404 days.

(21) Appl. No.: 18/393,823

(22) Filed: Dec. 22, 2023

(65) Prior Publication Data

US 2024/0222140 A1     Jul. 4, 2024

(30) Foreign Application Priority Data

Dec. 30, 2022     (TW) .................................. 111150923

(51) Int. Cl.
| | |
|---|---|
| *H10W 70/05* | (2026.01) |
| *H10P 14/40* | (2026.01) |
| *H10W 70/60* | (2026.01) |
| *H10W 72/20* | (2026.01) |
| *H10W 72/00* | (2026.01) |
| *H10W 72/30* | (2026.01) |
| *H10W 74/10* | (2026.01) |

(52) U.S. Cl.
CPC ............. *H10W 70/05* (2026.01); *H10P 14/40* (2026.01); *H10W 70/614* (2026.01); *H10W 72/244* (2026.01); *H10W 72/252* (2026.01); *H10W 72/321* (2026.01); *H10W 72/344* (2026.01); *H10W 72/856* (2026.01); *H10W 74/142* (2026.01)

(58) Field of Classification Search
CPC .......................... H10W 20/497; H10W 44/501
See application file for complete search history.

(56) References Cited

U.S. PATENT DOCUMENTS

| | | | |
|---|---|---|---|
| 11,443,892 B2 * | 9/2022 | Lee ........................ | H01F 27/327 |
| 2019/0295967 A1 * | 9/2019 | Darmawikarta .... | H10W 44/501 |

(Continued)

*Primary Examiner* — Benjamin P Sandvik

(57) ABSTRACT

A package carrier board includes a first circuit build-up structure, a patterned magnetic conductive metal layer, a plurality of first conductive pillar, a second insulating layer, and a second circuit build-up structure. The patterned magnetic conductive metal layer is disposed above the first circuit build-up structure, and the cross-sectional pattern of the patterned magnetic conductive metal layer is L-shaped and/or U-shaped. The first conductive pillars are disposed on the first circuit build-up structure and located outside of the patterned magnetic conductive metal layer. The second insulating layer covers the patterned magnetic conductive metal layer and the first conductive pillars. The second circuit build-up structure is disposed on the second insulating layer. The first circuit build-up structure, the first conductive pillars, the second insulating layer, and the second circuit build-up structure are combined to form an inductive circuit structure. Additionally, a manufacturing method for the package carrier board is also disclosed.

11 Claims, 7 Drawing Sheets

(56)     References Cited

U.S. PATENT DOCUMENTS

| | | | |
|---|---|---|---|
| 2022/0293327 A1* | 9/2022 | Ganesan ............. | H01F 17/0013 |
| 2023/0064355 A1* | 3/2023 | Hsu ..................... | H01F 27/2885 |
| 2023/0395312 A1* | 12/2023 | Yoshioka ............ | H01F 17/0006 |

* cited by examiner

20

16

163  161  162

14c

14b

14a

PACKAGE CARRIER BOARD INTEGRATED WITH INDUCTIVE CIRCUIT STRUCTURE AND MANUFACTURING METHOD THEREOF

CROSS REFERENCE TO RELATED APPLICATIONS

This Non-provisional application claims priority under 35 U.S.C. § 119(a) on Patent Application No. 111150923 filed in Republic of China on Dec. 30, 2022, the entire contents of which are hereby incorporated by reference.

BACKGROUND

1. Technical Field

This invention relates to a package carrier board and its manufacturing method, particularly relates to a package carrier board with an embedded inductive circuit structure and its manufacturing method.

2. Description of Related Art

With the increasing demand for miniaturization, integrated functionality, and enhanced performance in electronic products, integrating passive components into semiconductor devices is a commonly employed solution. For instance, power management integrated circuits or modules, transformers, and DC-DC converters often require the integration of one or more passive components. Passive components include but are not limited to inductors (including coils), resistors, capacitors, and oscillators, where inductors and coils are frequently used for voltage transformation, current choking, impedance matching, phase shifting, or as resonant circuits and filters. However, the relatively larger size of inductors necessitates more space, making it challenging to achieve thinness and miniaturization in semiconductor devices.

In order to achieve a higher inductance value, inductors typically incorporate magnetic core structures to enhance the quality factor and meet the requirements of electronic products. Therefore, providing a package carrier board integrated with an inductive circuit structure and its manufacturing method that can exhibit lower magnetic losses, lower impedance, reduced parasitic capacitance, and diminished eddy current effects, resulting in higher inductance values and improved quality factors, is a critical concern. This is aimed at reducing the energy consumption of inductors and enhancing their efficiency, ultimately leading to superior electrical performance, making it one of the current important subject matters.

SUMMARY OF THE INVENTION

In view of the foregoing, one objective of this invention is to provide a package carrier board and its manufacturing method that can embed and integrate the inductive circuit structure within the package carrier board. This enables the package carrier board to achieve thinness and miniaturization while enhancing the electrical efficiency of inductive components through a special structure.

To achieve the above objective, a method for manufacturing the package carrier board in this invention includes the following steps. Step (A) is to provide a first circuit build-up structure with a first insulating layer, a first patterned conductive circuit layer, and a first conductive pillar layer. Step (B) is to form a conductive layer, which has a plurality of first conductive pillars and a plurality of temporary first conductive walls, on the surface of the first insulating layer where the first conductive pillars are electrically connected to the first conductive pillar layer. Step (C) is to form a first photoresist layer to cover the first conductive pillars and a part of surface of the first insulating layer. Step (D) is to apply a magnetic metal material to cover the surface of the temporary first conductive wall and a part of surface of the first insulating layer. Step (E) is to form a second photoresist layer to cover the magnetic metal material and the first photoresist layer. Step (F) is to remove a portion of the first photoresist layer, the second photoresist layer, the magnetic metal material, the first conductive pillars, and the temporary first conductive wall to expose the top surface of the first conductive pillars and the temporary first conductive wall. Step (G) is to form a third photoresist layer to cover the top surface of the first conductive pillars. Step (H) is to remove the temporary first conductive wall to leave the unremoved magnetic metal material to form a patterned magnetic conductive metal layer. Step (I) is to remove the third photoresist layer, the second photoresist layer, and the first photoresist layer to expose the first conductive pillars and the patterned magnetic conductive metal layer. Step (J) is to form a second insulating layer on the first insulating layer to encapsulate the patterned magnetic conductive metal layer and the first conductive pillars, and to remove a portion of the second insulating layer to expose the top surface of the first conductive pillars. Step (K) is to form a second circuit build-up structure on the second insulating layer to electrically connect to the first conductive pillar, where the second circuit build-up structure has a third insulating layer, a second patterned conductive circuit layer, and a second conductive pillar layer. The first circuit build-up structure, the first conductive pillar layer, the first conductive pillars, and the second circuit build-up structure combine to form the inductive circuit structure. The patterned magnetic conductive metal layer is not electrically connected to the inductive circuit structure.

In one embodiment, step (D) is to form the magnetic metal material by electroplating or deposition and cover the surface of the temporary first conductive wall and a portion of the first insulating layer.

In one embodiment, step (H) is to remove the temporary first conductive wall by etching.

In one embodiment, the inductive circuit structure may be a spiral coil-shaped inductive circuit, a solenoid coil-shaped inductive circuit, or a toroidal coil-shaped inductive circuit, wherein an extension length of the temporary first conductive wall is approximately equal to an extension length of the coil of the inductive circuit so as to ensure that the extension length of the patterned magnetic conductive metal layer is also approximately equal to the extension length of the coil of the inductive circuit structure.

In one embodiment, before step (K) is performed, steps (B) through (J) may be repeated once or more times to form a plurality of stacked patterned magnetic conductive metal layers.

In one embodiment, before repeating steps (B) through (J), the method may also include forming a spacer insulating layer on the second insulating layer.

Additionally, to achieve the above, a package carrier board of the invention includes a first circuit build-up structure, a patterned magnetic conductive metal layer, a plurality of first conductive pillars, a second insulating layer, and a second circuit build-up structure. The first circuit build-up structure has a stacked arrangement of a patterned conductive circuit layer and a first conductive pillar layer, with the patterned conductive circuit layer and the first conductive pillar layer encapsulated in a first insulating layer. The patterned magnetic conductive metal layer is disposed above the first circuit build-up structure, and the cross-sectional pattern of the patterned magnetic conductive metal layer is in the shape of an L and/or U. The first conductive pillars are disposed on the first circuit build-up structure and are located on an outer side of the patterned magnetic conductive metal layer. The second insulating layer covers the patterned magnetic conductive metal layer and these first conductive pillars. The second circuit build-up structure is disposed on the second insulating layer, having a stacked arrangement of a second patterned conductive circuit layer and a second conductive pillar layer, with the second patterned conductive circuit layer and the second conductive pillar layer encapsulated in a third insulating layer. The second circuit build-up structure is electrically connected to these first conductive pillars. The first circuit build-up structure, the first conductive pillar, and the second circuit build-up structure are combined to form a spiral coil-shaped inductive circuit, a solenoid coil-shaped inductive circuit, or a toroidal coil-shaped inductive circuit. The patterned magnetic conductive metal layer is positioned within the inductive circuit structure and is not electrically connected to each other and an extension length of the patterned magnetic conductive metal layer is approximately equal to an extension length of the inductive circuit structure.

In one embodiment, the patterned magnetic conductive metal layer is arranged in a stacked configuration with a plurality of layers.

In one embodiment, a spacer insulating layer is disposed between the stacked layers of the patterned magnetic conductive metal layer.

In one embodiment, the material of the patterned magnetic conductive metal layer includes iron, nickel, cobalt, zinc, or an alloy containing at least two of these elements or two or more, with alloy doping of materials such as manganese, molybdenum, boron, copper, or vanadium.

In one embodiment, the materials of the first insulating layer, the second insulating layer, the third insulating layer, and the spacer insulating layer include organic photosensitive dielectric materials, organic non-photosensitive dielectric materials, and/or inorganic oxide materials.

In one embodiment, the first circuit build-up structure, the first conductive pillar, and the second circuit build-up structure combine to form a spiral coil-shaped inductive circuit, a solenoid coil-shaped inductive circuit, or a toroidal coil-shaped inductive circuit, wherein the extension length of the patterned magnetic conductive metal layer is approximately equal to the extension length of the coil of the inductive circuit.

The detailed technology and preferred embodiments implemented for the subject invention are described in the following paragraphs accompanying the appended drawings for people skilled in this field to well appreciate the features of the claimed invention.

BRIEF DESCRIPTION OF THE DRAWINGS

The parts in the drawings are not necessarily drawn to scale, the emphasis instead being placed upon clearly illustrating the principles of at least one embodiment. In the drawings, like reference numerals designate corresponding parts throughout the various diagrams, and all the diagrams are schematic.

DETAILED DESCRIPTION

In order to enable those with ordinary knowledge in the technical field to understand the contents of the present invention and implement the contents of the present invention, appropriate embodiments and drawings are described as follows.

Figure 1:
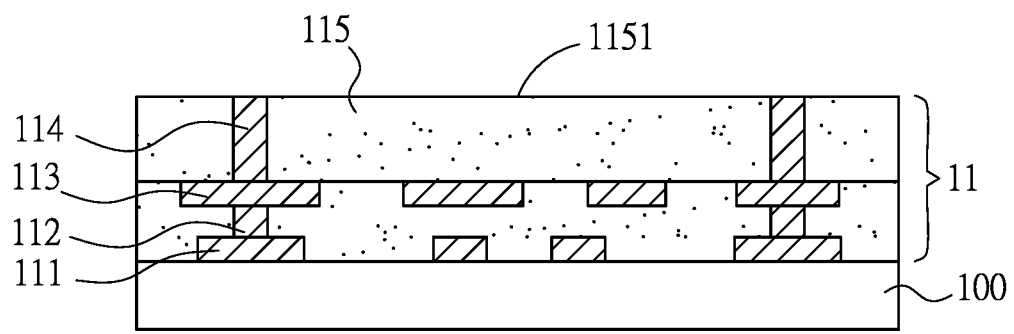
FIGS. 1 to 10 illustrate schematic cross-sectional views of a package carrier board according to an embodiment of the manufacturing method of the invention.

To illustrate the manufacturing method of the package carrier board according to a preferred embodiment of the present invention, reference is made to the accompanying figures. First, please refer to FIG. 1, where a first circuit build-up structure 11 is formed on a carrier board 100. In this embodiment, the first circuit build-up structure 11 includes a first patterned conductive circuit layers 111, 113, and a first conductive pillar layers 112, 114, encapsulated in a first insulating layer 115. The first circuit build-up structure 11 can be formed through semiconductor processes such as Copper Connection in Material (C2iM) technology or Semi-additive Process (SAP). It should be noted that the first patterned conductive circuit layers 111, 113, and the first conductive pillar layers 112, 114 constitute the same layer or upper and lower layers of electrical conduction. Additionally, the first insulating layer 115 is not limited to a single-layer structure; it can include a plurality of sub-layers stacked. These sub-layers correspond to each of the first patterned conductive circuit layers 111, 113, and the first conductive pillar layers 112, 114. The first conductive pillar layer can also be a single layer of conductive pillars layer, and the number of layers is not limited.

Figure 2:
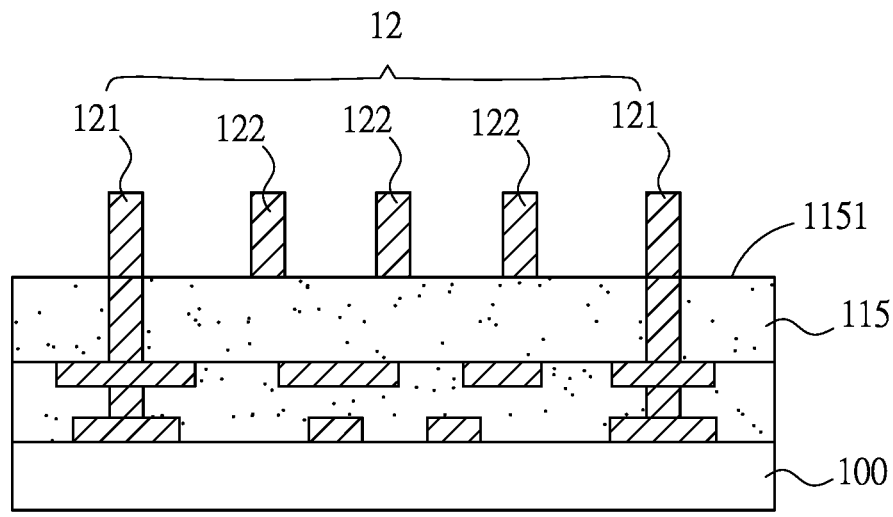
Figure 2A:
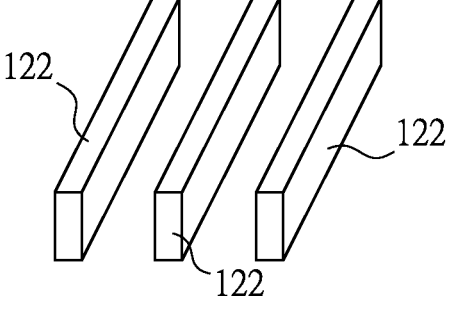
FIG. 2A separately shows a partial three-dimensional schematic view of the temporary first conductive wall.

Please refer to FIG. 2. Next, a conductive layer 12 is formed on a surface 1151 of the first insulating layer 115. The conductive layer 12 includes two first conductive pillars 121 and three temporary first conductive walls 122, although the quantity is not limiting. The conductive layer 12 may be formed through electroplating. It is to be noted that the temporary first conductive walls 122, as shown in the partial three-dimensional diagram in FIG. 2A, are continuous walls, and the extension length of these temporary first conductive walls 122 is approximately equal to the extension length of the coil of the inductive circuit. In other embodiments, the temporary first conductive walls 122 may also be segmented walls.

Figure 3:
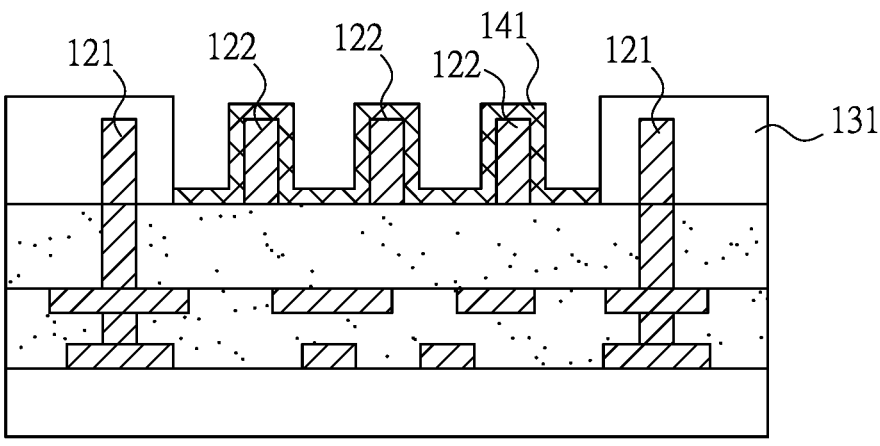

As shown in FIG. 3, a first photoresist layer 131 is then formed to cover the first conductive pillar 121 and a portion of the surface 1151 of the first insulating layer 115. Specifically, the first photoresist layer 131 may be initially applied to cover the conductive layer 12 and the entire surface 1151 of the first insulating layer 115. Subsequently, through the exposure and development process, a portion of the first photoresist layer 131 is removed to expose the temporary first conductive walls 122 and a portion of the surface 1151. Next, a magnetic metal material 141 is formed to cover the outer surface of the temporary first conductive walls 122 (including the top and sides) and a portion of the surface 1151 of the first insulating layer 115. In the embodiment, the material of the magnetic metal material 141 includes but is not limited to iron (Fe), nickel (Ni), cobalt (Co), zinc (Zn), or an alloy containing at least two of these elements (including more). The alloy may also be doped with materials such as manganese (Mn), molybdenum (Mo), boron (B), copper (Cu), or vanadium (V).

Figure 4:
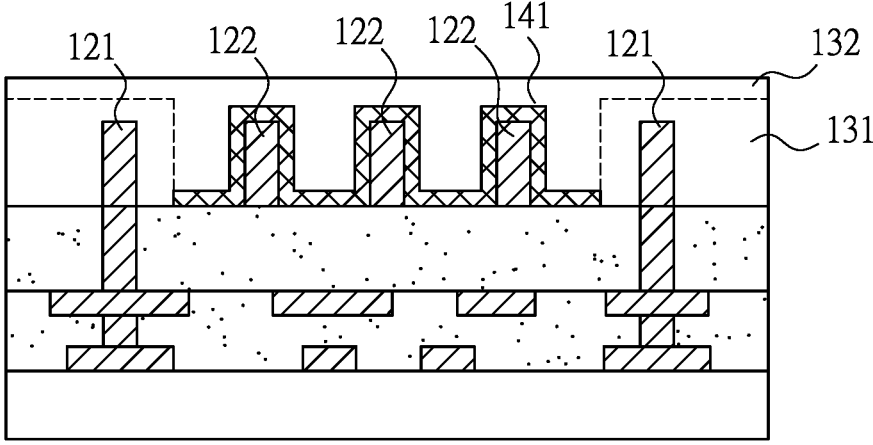
Figure 5:
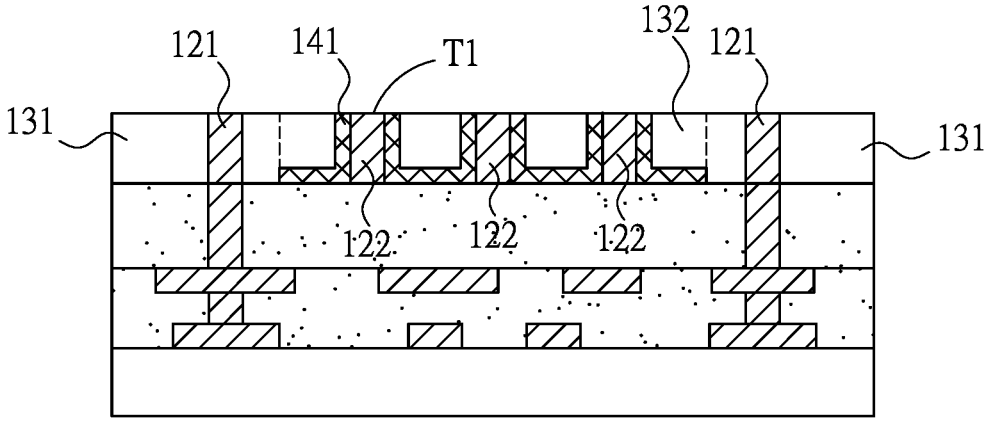

As shown in FIG. 4, a second photoresist layer 132 is then formed to cover the first photoresist layer 131 and the magnetic metal material 141. Subsequently, as shown in FIG. 5, portions of the first photoresist layer 131, portions of the second photoresist layer 132, and portions of the magnetic metal materials 141 are removed to expose a top surface T1 of the temporary first conductive wall 122.

In this embodiment, portions of the first photoresist layer 131, portions of the second photoresist layer 132, and portions of the magnetic metal material 141 are removed through grinding. In other embodiments, it is also possible to expose the top surface T1 of the temporary first conductive wall 122 by grinding immediately after forming the magnetic metal material 141, and this is not limited.

Figure 6:
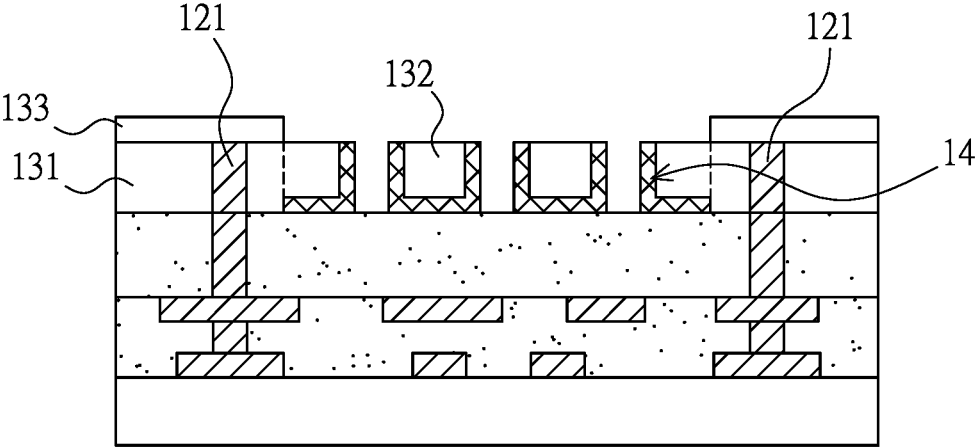
Figure 7:
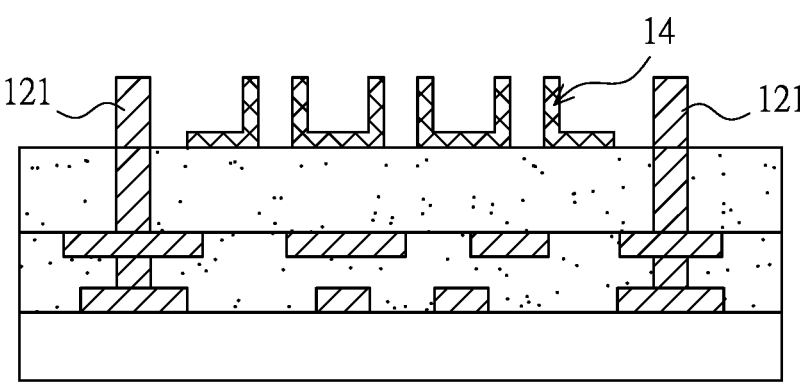
Figure 7A:
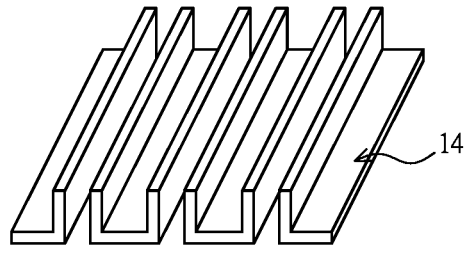
FIG. 7A separately shows a partial three-dimensional schematic view of the in patterned magnetic conductive metal layer.
Figure 8:
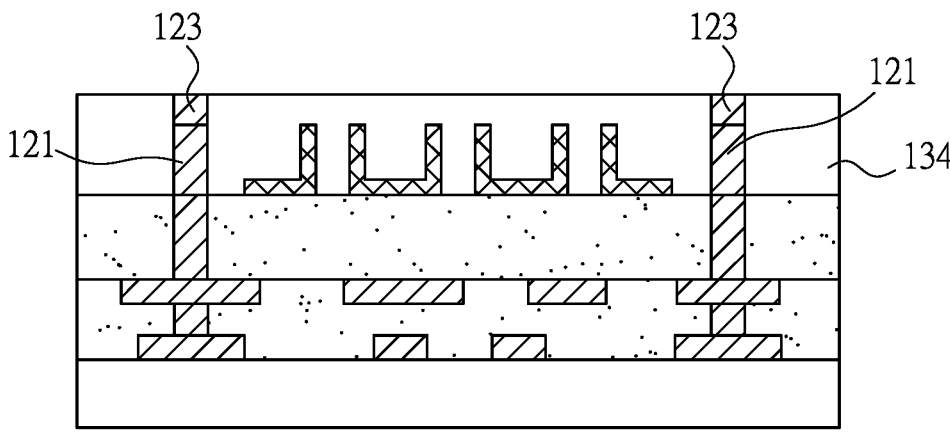
Figure 9:
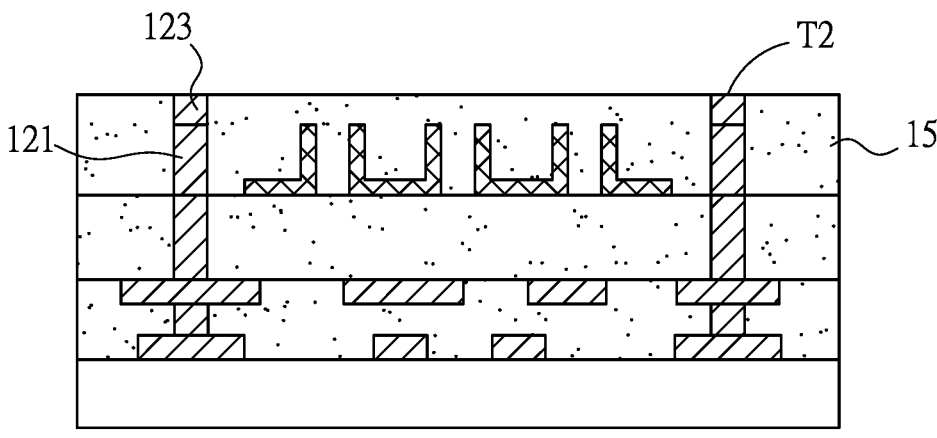

As shown in FIGS. 6 and 7, a third photoresist layer 133 is then formed on the first photoresist layer 131 to cover the exposed first conductive pillar 121 (shown in FIG. 6). Subsequently, through processes such as etching, the temporary first conductive wall 122 is removed to form a patterned magnetic conductive metal layer 14. The remaining portions of the first photoresist layer 131, the second photoresist layer 132, and the third photoresist layer 133 are removed through etching processes (shown in FIG. 7). Because the patterned magnetic conductive metal layer 14 is shaped along the outer contour of the temporary first conductive wall 122, the cross-sectional pattern of the patterned magnetic conductive metal layer 14 includes L-shapes and U-shapes. As shown in the partial three-dimensional diagram in FIG. 7A, the overall structure is thin or sheet-like, and the extension length of the patterned magnetic conductive metal layer 14 is approximately equal to the extension length of the coil of the inductive circuit. Subsequently, as shown in FIG. 8, a fourth photoresist layer 134 is formed to cover the first conductive pillar 121 and the patterned magnetic conductive metal layer 14. Openings are then formed in the fourth photoresist layer 134 at positions corresponding to the first conductive pillar 121, and a second conductive pillar 123 is electroplated into the openings. After removing the fourth photoresist layer 134, as shown in FIG. 9, a second insulating layer 15 is formed to cover the first conductive pillar 121, the second conductive pillar 123, and the patterned magnetic conductive metal layer 14. Subsequent grinding may expose a top surface T2 of the second conductive pillar 123.

Figure 10:
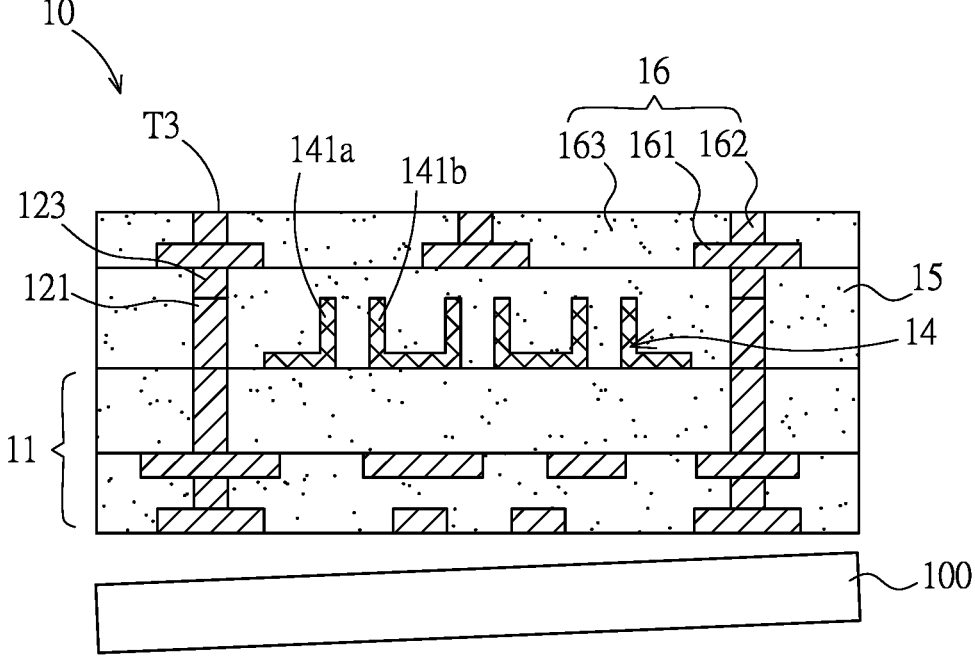

As shown in FIG. 10, a second circuit build-up structure 16 is then formed on the second insulating layer 15. The second circuit build-up structure 16 can be formed using the same or different processes as the first circuit build-up structure 11, without limitation. In this embodiment, the second circuit build-up structure 16 includes a third insulating layer 163, with a second patterned conductive circuit layer 161 and a second conductive pillar layer 162 covered by the third insulating layer 163. It should be noted that a top surface T3 of the conductive pillar in the second conductive pillar layer 162 may be exposed in the third insulating layer 163 and may serve as a pad for electrical connection. Finally, the carrier board 100 is removed to form the package carrier board 10 of the preferred embodiment of the invention. In the embodiment, the patterned conductive circuits and conductive pillars in the build-up circuit structures can form inductive coils. Additionally, the first circuit build-up structure 11, the conductive layer 12, the second insulating layer 15, and the second circuit build-up structure 16 may collectively become a spiral coil-shaped inductive circuit, a solenoidal coil-shaped inductive circuit, or a ring-shaped inductive circuit.

Additionally, the material of the insulating layers mentioned above may include organic photosensitive dielectric materials or organic non-photosensitive dielectric materials. Examples of these materials include insulating materials containing glass fibers and organic resins. The organic resins may include, but are not limited to, substrates or prepregs such as BT, FR4, or FR5 epoxy resins, organic substrates like Ajinomoto Build-up Film (ABF), epoxy molding compounds (EMC), film-like EMC, or polyimide (PI). Some insulating layers may also include micrometer-scale or nanometer-scale inorganic oxide materials, such as silicon oxide (SiOx), nickel oxide (NiO), or copper oxide. In certain specific embodiments, each insulating layer may be composed of the same or different materials.

Figure 11:
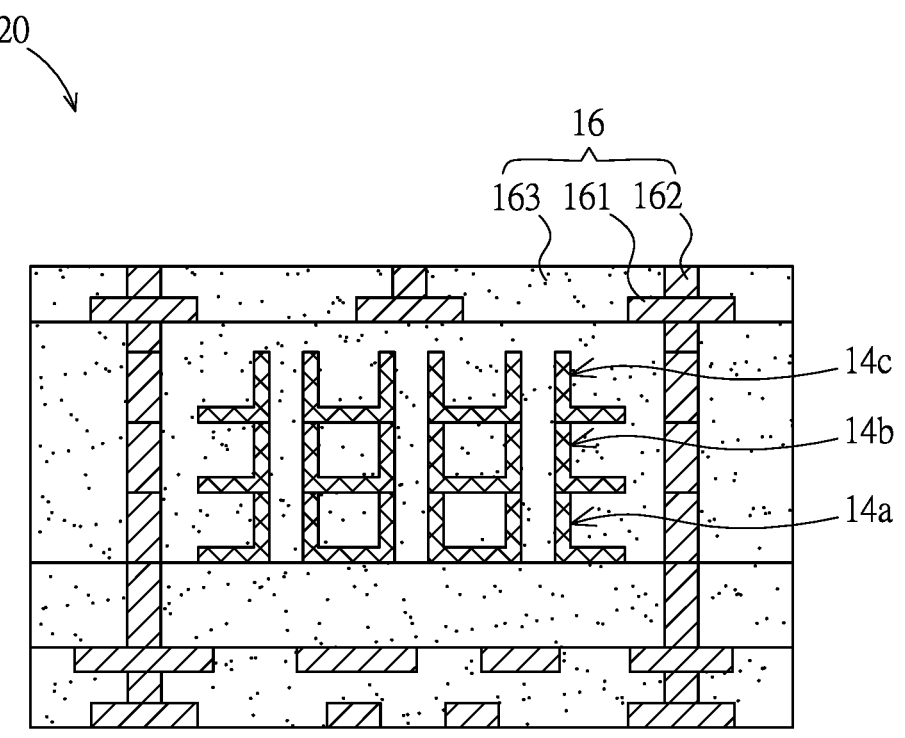
FIG. 11 illustrates a cross-sectional schematic view of a variant of the package carrier board according to the invention.

The package carrier board 10 described above consists of a single-layer patterned magnetic conductive metal layer 14. In other embodiments, depending on the requirements, such as the need for inductance value or quality factor, multiple layers of the patterned magnetic conductive metal layer can be designed. As shown in FIG. 11, a package carrier board 20 includes three stacked layers of patterned magnetic conductive metal layer 14a, 14b, and 14c, but the number of layers is not limited. Additionally, the patterns of each layer of the patterned magnetic conductive metal layer 14a, 14b, and 14c may not necessarily be the same and can be adjusted according to specific requirements.

Figure 12:
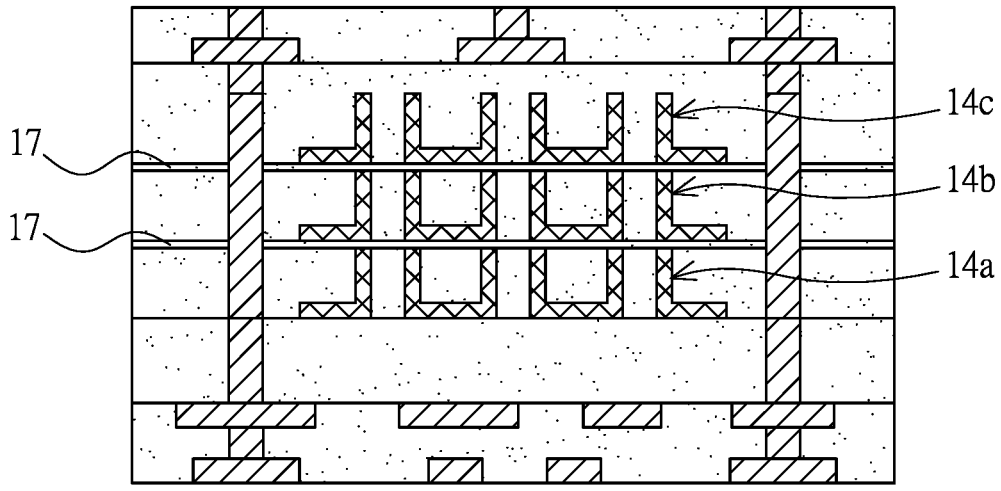
FIG. 12 illustrates a cross-sectional schematic view of the package carrier board of the invention, including the spacer insulating layer.

Furthermore, as illustrated in FIG. 12, each patterned magnetic conductive metal layer 14a, 14b, and 14c may include a spacer insulating layer 17 to separate the layers of the patterned magnetic conductive metal layer without contacting each other. The material and manufacturing method of the spacer insulating layer 17 are the same or similar to the previously mentioned insulating layers and are not further elaborated here.

In summary, the invention, including the package carrier board integrated with the inductive circuit structure and its manufacturing method, embeds the inductive circuit structure (inductor) into the package carrier board, as shown in FIG. 10. The formation of the patterned magnetic conductive metal layer 14 involves initially electroplating to create conductive walls, followed by electroplating or deposition on the surface of these walls. This process allows the creation of a fine-pitch structure between the first part 141a and the second part 141b in the longitudinal direction of the patterned magnetic conductive metal layer 14, enhancing the inductance value. In other words, adjusting the width and spacing of the conductive walls makes it easier to produce products with fine-pitch magnetic metal. Therefore, the package carrier board integrated with the inductive circuit structure and its manufacturing method in this invention can achieve lower magnetic losses, lower impedance, smaller parasitic capacitance, and lower eddy current effects, resulting in higher inductance values, and better quality factors. This helps reduce the energy consumption of magnetic components, improve efficiency, and achieve excellent electrical characteristics. Additionally, it allows further size reduction of the packaging structure to approximately 0.2 mm thickness, making it suitable for thin and miniaturized designs.

Even though numerous characteristics and advantages of certain inventive embodiments have been set out in the foregoing description, together with details of the structures and functions of the embodiments, the disclosure is illustrative only. Changes may be made in detail, especially in matters of arrangement of parts, within the principles of the present disclosure to the full extent indicated by the broad general meaning of the terms in which the appended claims are expressed.

What is claimed is:

1. A manufacturing method for a package carrier board integrated with an inductive circuit structure, comprising:

step (A) is to provide a first circuit build-up structure with a first insulating layer, a first patterned conductive circuit layer, and a first conductive pillar layer;

step (B) is to form a conductive layer, which has a plurality of first conductive pillars and a plurality of temporary first conductive walls, on the surface of the first insulating layer wherein the first conductive pillars are electrically connected to the first conductive pillar layer;

step (C) is to form a first photoresist layer to cover the first conductive pillars and a part of surface of the first insulating layer;

step (D) is to apply a magnetic metal material to cover the surface of the temporary first conductive wall and a part of surface of the first insulating layer;

step (E) is to form a second photoresist layer to cover the magnetic metal material and the first photoresist layer;

step (F) is to remove a portion of the first photoresist layer, the second photoresist layer, the magnetic metal material, the first conductive pillars, and the temporary first conductive wall to expose a top surface of the first conductive pillars and a top surface of the temporary first conductive wall;

step (G) is to form a third photoresist layer to cover the top surface of the first conductive pillars;

step (H) is to remove the temporary first conductive wall to leave the unremoved magnetic metal material to form a patterned magnetic conductive metal layer;

step (I) is to remove the third photoresist layer, the second photoresist layer, and the first photoresist layer to expose the first conductive pillars and the patterned magnetic conductive metal layer;

step (J) is to form a second insulating layer on the first insulating layer to encapsulate the patterned magnetic conductive metal layer and the first conductive pillars, and to remove a part of the second insulating layer to expose the top surface of the first conductive pillars; and step (K) is to form a second circuit build-up structure on the second insulating layer to electrically connect to the first conductive pillars, wherein the second circuit build-up structure has a third insulating layer, a second patterned conductive circuit layer, and a second conductive pillar layer;

wherein the first circuit build-up structure, the first conductive pillars, and the second circuit build-up structure is combined to form the inductive circuit structure;

wherein the patterned magnetic conductive metal layer is not electrically connected to the inductive circuit structure.

2. The manufacturing method for the package carrier board integrated with the inductive circuit structure of claim 1, wherein step (D) is to form the magnetic metal material by electroplating or deposition and cover the surface of the temporary first conductive wall and a part of surface of the first insulating layer.

3. The manufacturing method for the package carrier board integrated with the inductive circuit structure of claim 1, wherein step (H) is to remove the temporary first conductive wall by etching.

4. The manufacturing method for the package carrier board integrated with the inductive circuit structure of claim 1, wherein the inductive circuit structure is a spiral coil-shaped inductive circuit, a solenoid coil-shaped inductive circuit, or a toroidal coil-shaped inductive circuit, wherein an extension length of the temporary first conductive wall is approximately equal to an extension length of the coil of the inductive circuit so as to ensure that the extension length of the patterned magnetic conductive metal layer is also approximately equal to the extension length of the coil of the inductive circuit structure.

5. The manufacturing method for the package carrier board integrated with the inductive circuit structure of claim 1, wherein before step (K) is performed, steps (B) through (J) may be repeated once or more times to form a plurality of stacked patterned magnetic conductive metal layers.

6. The manufacturing method for the package carrier board integrated with the inductive circuit structure of claim 5, wherein before repeating steps (B) through (J), the method further comprises forming a spacer insulating layer on the second insulating layer.

7. A package carrier board integrated with an inductive circuit structure, comprising:

a first circuit build-up structure, which has a stacked arrangement of a first patterned conductive circuit layer and a first conductive pillar layer, with the first patterned conductive circuit layer and the first conductive pillar layer encapsulated in a first insulating layer;

a patterned magnetic conductive metal layer, which is disposed above the first circuit build-up structure, and the cross-sectional pattern of the patterned magnetic conductive metal layer is in the shape of an L and/or U;

a plurality of first conductive pillars, which are disposed on the first circuit build-up structure and located on an outer side of the patterned magnetic conductive metal layer;

a second insulating layer, which covers the patterned magnetic conductive metal layer and the first conductive pillars; and a second circuit build-up structure, which is disposed on the second insulating layer, having a stacked arrangement of a second patterned conductive circuit layer and a second conductive pillar layer, with the second patterned conductive circuit layer and the second conductive pillar layer encapsulated in a third insulating layer, wherein the second circuit build-up structure is electrically connected to the first conductive pillars;

wherein the first circuit build-up structure, the first conductive pillar, and the second circuit build-up structure are combined to form a spiral coil-shaped inductive circuit, a solenoid coil-shaped inductive circuit, or a toroidal coil-shaped inductive circuit, wherein the patterned magnetic conductive metal layer is positioned within the inductive circuit structure and is not electrically connected to each other and an extension length of the patterned magnetic conductive metal layer is approximately equal to an extension length of the inductive circuit structure.

8. The package carrier board integrated with the inductive circuit structure of claim 7, wherein the patterned magnetic conductive metal layer is arranged in a stacked configuration with a plurality of layers.

9. The package carrier board integrated with the inductive circuit structure of claim 8, wherein a spacer insulating layer is disposed between each of the stacked layers of the patterned magnetic conductive metal layer;

wherein the material of the spacer insulating layer includes organic photosensitive dielectric materials, organic non-photosensitive dielectric materials, and/or inorganic oxide materials;

wherein the organic dielectric material composition includes organic resin, and the organic resin includes epoxy resin of substrate or prepreg such as BT, FR4, or FR5, organic substrate ABF, epoxy molding compound, film-like EMC, or polyimide; and wherein the composition of the inorganic oxide material includes micrometer-scale or nanometer-scale silicon oxide, nickel oxide, or copper oxide.

10. The package carrier board integrated with the inductive circuit structure of claim 7, wherein the material of the patterned magnetic conductive metal layer includes iron, nickel, cobalt, zinc, or an alloy containing at least two of these elements or two or more, with alloy doping of materials such as manganese, molybdenum, boron, copper, or vanadium.

11. The package carrier board integrated with the inductive circuit structure of claim 7, wherein the materials of the first insulating layer, the second insulating layer, and the third insulating layer include organic photosensitive dielectric materials, organic non-photosensitive dielectric materials, and/or inorganic oxide materials;

wherein the organic dielectric material composition includes organic resin, and the organic resin includes epoxy resin of substrate or prepreg such as BT, FR4, or FR5, organic substrate ABF, epoxy molding compound, film-like EMC, or polyimide; and wherein the composition of the inorganic oxide material includes micrometer-scale or nanometer-scale silicon oxide, nickel oxide, or copper oxide.

* * * * *